United States Patent
Bucksch et al.

(10) Patent No.: US 6,898,739 B2
(45) Date of Patent: May 24, 2005

(54) METHOD AND DEVICE FOR TESTING A MEMORY CIRCUIT

(75) Inventors: Thorsten Bucksch, München (DE); Ralf Schneider, München (DE)

(73) Assignee: Infineon Technologies AG, Munich (DE)

(*) Notice: Subject to any disclaimer, the term of this patent is extended or adjusted under 35 U.S.C. 154(b) by 538 days.

(21) Appl. No.: 10/151,989

(22) Filed: May 21, 2002

(65) Prior Publication Data

US 2002/0174386 A1 Nov. 21, 2002

(30) Foreign Application Priority Data

May 21, 2001 (DE) .......................... 101 24 742

(51) Int. Cl.$^7$ .............................................. G06F 11/00
(52) U.S. Cl. ........................................ 714/42; 714/718
(58) Field of Search ........................ 714/42, 718, 721

(56) References Cited

U.S. PATENT DOCUMENTS

| | | | | |
|---|---|---|---|---|
| 4,502,140 A | * | 2/1985 | Proebsting | .................. 714/721 |
| 5,157,629 A | * | 10/1992 | Sato et al. | .................. 365/201 |
| 5,255,230 A | * | 10/1993 | Chan et al. | .................. 365/201 |
| 5,386,422 A | * | 1/1995 | Endoh et al. | .......... 365/185.22 |
| H1741 H | * | 7/1998 | Cruts | .......................... 714/720 |
| 6,049,899 A | * | 4/2000 | Auclair et al. | .............. 365/201 |
| 6,115,834 A | * | 9/2000 | Jen et al. | ..................... 714/718 |
| 6,216,241 B1 | | 4/2001 | Fenstermaker et al. | |
| 6,442,719 B1 | * | 8/2002 | Beffa et al. | ................. 714/721 |
| 6,453,433 B1 | * | 9/2002 | Vollrath | ...................... 714/718 |
| 6,550,032 B1 | * | 4/2003 | Zhao et al. | ................. 714/730 |

* cited by examiner

*Primary Examiner*—Scott Baderman
*Assistant Examiner*—Paul F. Contino
(74) *Attorney, Agent, or Firm*—Laurence A. Greenberg; Werner H. Stemer; Raph E. Locher

(57) ABSTRACT

A method for testing a memory circuit selects each cell in a region of a cell array as a target cell and performs a test cycle which includes selecting the target cell and neighboring cells which contain at least those cells for which is cannot be ruled out that their operation causes a fault-producing interaction. A data item is written to the target cell in order to produce one of two defined states. A write signal is applied to the neighboring cells in order to produce an undefined state which lies between the two defined states. The target cell and the neighboring cells are then read and the result of the reading process is used to check whether there is any interaction between the operation of the target cell and the operation of the neighboring cells.

15 Claims, 3 Drawing Sheets

FIG. 2

| Step 202 | X | X | X | 1 | X | X | X |
|---|---|---|---|---|---|---|---|
| Step 203 | 1 | 0 | 1 | 1 | 1 | 1 | 0 |
| Step 204 | 0 | 1 | 0 | 1 | 0 | 0 | 1 |
| Step 205 | 0 | 1 | 1 ! | 0 ! | 0 | 0 | 1 |

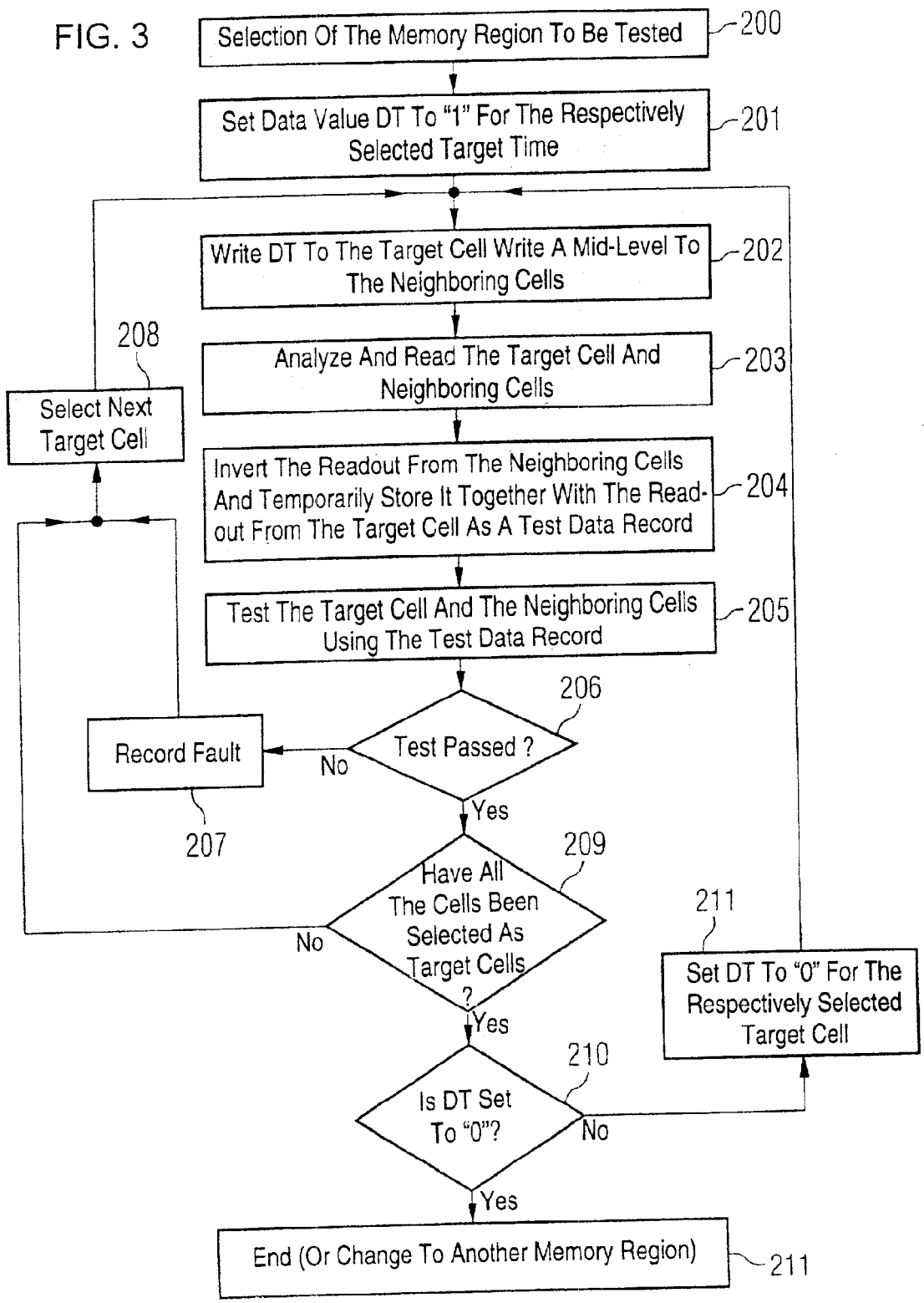

METHOD AND DEVICE FOR TESTING A MEMORY CIRCUIT

BACKGROUND OF THE INVENTION

Field of the Invention

The invention relates to a method for testing a data memory circuit and to a device for carrying out such a method.

Circuit configurations for storing information generally contain a plurality of memory cells, each of which can store one information element or "data item." In this case, the information content of the stored data item is represented by the value of a physical state variable of the cell, for example by the level of the electrical charge in a capacitance (capacitor). In the case of memory cells for binary data, two different states are defined, which are associated with the two binary values or data values "0" and "1." In the case of cells which store data capacitively, the "uncharged" state is normally associated with the data value 0, and the "charged" state is normally associated with the data value 1. There are also data memories with cells in which the data is stored by a state variable other than the electrical charge, for example by magnetization. In these cases, the data values 0 and 1 are associated with the values of the state variable in a similar manner.

In addition to the memory cells which form the actual storage medium, a memory circuit also contains a device which controls selective access to the cells in order to write a data item to, or to read a data item from, any desired cell. An access device such as this contains a device for addressing a desired memory cell and, at this cell, for selectively either producing a desired state by application of an appropriate write signal, or for sensing the existing state. As a result of unavoidable circuit tolerances, environmental influences and the like, the values of the associated signals that actually occur and, frequently, the possible states of a cell are frequently not just restricted to two extreme values which would be associated with the data values 0 and 1. Two threshold values, at a distance from one another, are therefore defined for each of these variables. All values which are equal to or greater than the upper threshold value are regarded as a first "defined state" and are associated with the first data value (for example "1"). All values which are equal to or less than the lower threshold value are regarded as a second defined state, and are associated with the second data value (for example "0"). Values which lie in the range between the two threshold values are regarded as being in an "undefined state."

Cell states which have been sensed are associated with the data value 0 or 1 in an analysis circuit which receives the relevant sensed signal and is part of the access device. If the sensed signal for an addressed cell indicates one of the two defined states, then the analysis circuit sets the level of a binary data signal produced by it to the associated binary value 0 or 1. If the sensed signal indicates the existence of the undefined state, then the analysis circuit can produce "undecided" information (for example by keeping its output at a high impedance or by emitting a central signal level), if it is able to do this. If the analysis circuit includes a latching amplifier (read amplifier), as is generally the case, then it will set the data signal unpredictably to 0 or 1, depending on some random phenomena, even when an undefined cell state exists.

During operation of memory circuits, undesirable coupling phenomena can occur during the writing and reading processes, leading to corruption of the stored data or of the sensed signals. In particular, a capacitive, resistive or else inductive coupling can occur between the various supply lines which run from the access device to the various memory cells. It is thus possible, for example, for a high potential which appears on a sense line when reading a cell state that corresponds to the data value 1 to cause the potential on an adjacent sense line to be increased by capacitive coupling. If a cell whose state corresponds to the data value 0 is now read at the same time via this adjacent line, then the increase in potential can "destructively" lead to the signal sensed there no longer indicating the defined 0 state but, in fact, the undefined state or even the defined 1 state. Both lead to a read error. If, on the other hand, a cell whose state corresponds to the data value 1 is read via the adjacent line, then the increase in potential acts "constructively", that is to say there will be no read error.

The above example in its own right makes it clear that any coupling that exists sometimes has an effect and sometimes does not, irrespective of its strength, depending on the data occupancy pattern in the memory cells, that is to say as a function of the "data topology". Each coupling thus has critical data topologies and noncritical data topologies. This is a problem when testing memory circuits.

In the normal test procedures for RAMs (Random Access Memories), all the memory cells are written to and read from again using a selected data topology, and each data item that is read is compared with the data item previously written to the relevant cell in order to emit a fault message if they do not match. This test cycle is generally repeated several times with different data topologies, in the hope of covering topology-dependent faults as well. However, as can easily be seen, it is impossible to run through all possible topologies in this case (even with an extremely small memory with only 64 cells, this would necessitate $2^{64}$ test cycles, that is to say more than 10 trillion test cycles!). In order to manage with a reasonable number of test cycles, the procedure until now has been to attempt to predict configuration-specific and layout-specific critical data topologies. In layouts in each sense lines cross over one another once or more in the course of their length (bit line twist), in order to reduce major couplings, this prediction process is considerably more difficult since particular side effects once again occur here. Until now, attempts have been made to find other critical data topologies by trial and error. All these methods are very complex and require a long time. The same is true if attempts are made to find critical data topologies through the use of application tests, that is to say by trial operation in the operational environment (for example with PC programs).

SUMMARY OF THE INVENTION

It is accordingly an object of the invention to provide a method of testing a memory circuit which overcomes the above-mentioned disadvantages of the heretofore-known methods of this general type and through the use of which even all those faults which depend on the data topology can be found more reliably than with conventional methods and with an acceptable level of effort.

With the foregoing and other objects in view there is provided, in accordance with the invention, a method for testing a memory circuit, the method includes:

providing the memory circuit with a cell array and an access device, the cell array including a plurality of cells for storing a binary data item in the form of one of two defined states, the access device being configured to selectively address the cells and to one of apply a write signal to an addressed one of the cells in order to produce a desired state in the addressed one of the cells and read out the addressed one of the cells by sensing and analyzing a state of the addressed one of the cells;

successively selecting all cells in at least one region of the cell array as target cells and carrying out a test cycle on each of the target cells, the test cycle including:

A) selecting a target cell together with a set of neighboring cells, the set of neighboring cells including at least those cells for which a possibility of an operation having a fault-producing interaction with an operation of the target cell cannot be ruled out;

B) writing a data item to the target cell in order to produce one of the two defined states, and applying a write signal to the neighboring cells in order to produce an undefined state which lies between the two defined states;

C) reading the target cell and the neighboring cells; and

D) checking whether there is any interaction between an operation of the target cell and an operation of the neighboring cells by using a result of the step of reading the target cell and the neighboring cells.

In other words, the invention relates to a method for testing a memory circuit, which contains a cell array with a large number of cells for storing one binary data item in each case in the form of one or the other of two defined states and has an access device in order to address the cells selectively and in order either to selectively apply a write signal to the respectively addressed cell in order to produce a desired state in the cell or to read the cell by sensing and analyzing its state. According to the invention, all the cells in at least one region of the cell array are selected successively as a target cell, and a test cycle including the following steps is carried out at each target cell: together with the target cell, a set of neighboring cells is selected which contains at least those cells for which it is impossible to rule out the possibility of their operation having a fault-producing interaction with the operation of the target cell. The target cell has a data item written to it in order to produce one of the two defined states, and the neighboring cells have a write signal applied to them in order to produce an undefined state which is between the two defined states. The target cell and the neighboring cells are then read and the result of the reading process is used to check whether there is any interaction between the operation of the target cell and the operation of the neighboring cells.

According to another mode of the invention, step B) includes applying the write signal to the neighboring cells such that the undefined state lies substantially at a mid-point between the two defined states.

Another mode of the method according to the invention includes the step of selecting, as the neighboring cells, all cells in the at least one region of the cell array other than the target cell.

Yet another mode of the method according to the invention includes the steps of providing the cells in the cell array in a form of a matrix of rows and columns and connecting all cells in each respective one of the rows to a respective common word line, and connecting all cells in each respective one of the columns to a respective common bit line such that cell states are written to and sensed via the common word line and the common bit line; and selecting, as the neighboring cells, at least those cells which are located in a same row as the target cell and are up to a given distance away from the target cell.

A further mode of the method according to the invention includes the step of selecting, as the neighboring cells, at least all cells other than the target cell which are located in a same row as the target cell.

Another mode of the method according to the invention includes the step of selecting, as the neighboring cells, only all those cells other than the target cell which are located in a same row as the target cell.

A further mode of the method according to the invention includes the steps of repeating steps A) to C) a number of times and storing respectively read data values in a storage; and using, in step D), the data values stored in the storage in order to check whether and which of the neighboring cells predominantly give one of a same data value as a data value of the target cell and a data value complementary to the data value of the target cell.

According to another mode of the invention, step D) includes the following partial steps:

D1) writing a data value read from the target cell in step C) back to the target cell without changing the data value, and writing data values read from the neighboring cells in step C) in an inverted form back to respective ones of the neighboring cells;

D2) reading the target cell and the neighboring cells once again for providing a given set of data values, and comparing the given set of data values with a set of data values written back in step D1); and D3) producing a fault message if the given set of data values and the set of data values written back in step D1) do not match.

According to a further mode of the invention, step D) includes the following partial steps:

D1) writing a data value read from the target cell in step C) in an inverted form back to the target cell, and writing data values read from the neighboring cells in step C) unchanged back to respective ones of the neighboring cells;

D2) reading the target cell and the neighboring cells once again for providing a given set of data values, and comparing the given set of data values with a set of data values written back in step D1); and D3) producing a fault message if the given set of data values and the set of data values written back in step D1) do not match.

Another mode of the method according to the invention includes the step of repeating the test cycle including steps A) to D) for each of the target cells wherein the data item is written to the target cell for producing a respective other one of the two defined states.

Another mode of the method according to the invention includes the step of using a subregion of the cell array that contains neither the target cell nor the neighboring cells for temporarily storing data values read from the target cell and from the neighboring cells.

With the objects of the invention in view there is also provided, in combination with a memory circuit including a cell array and an access device, the cell array including a plurality of cells for storing a binary data item as one of two defined states, the access device being configured to selectively address the cells and to one of apply a write signal to an addressed one of the cells in order to produce a desired state in the addressed one of the cells and read out the addressed one of the cells by sensing and analyzing a state of the addressed one of the cells, a device for testing the memory circuit which includes:

a test writing device for applying write signals to a selectable subset of the cells in the cell array in order to produce an undefined cell state which lies between the two defined states;

a sequence control device operatively connected to the access device and the test writing device; and the sequence control device, when being activated, being configured to control the access device and the test writing device such that a test cycle is carried out, the test cycle includes selecting, from the plurality of cells, a target cell together with a set of neighboring cells, the set of neighboring cells including at least those cells for which a possibility of an operation having a fault-producing interaction with an operation of the target cell cannot be ruled out, writing a data item to the target cell in order to produce one of the two defined states, and applying a write signal to the neighboring cells in order to produce an undefined state which lies between the two defined states, reading the target cell and the neighboring cells, and checking whether there is any interaction between an operation of the target cell and an operation of the neighboring cells by using a result of the step of reading the target cell and the neighboring cells.

According to another feature of the invention, at least the test writing device and the memory circuit are integrated on the same chip.

According to another feature of the invention, the test circuit including the test writing device and the sequence control device are integrated on the same chip as the memory circuit.

With the objects of the invention in view there is also provided, a semiconductor chip, including:

a memory circuit including a cell array and an access device, the cell array including a plurality of cells for storing a binary data item as one of two defined states, the access device being configured to selectively address the cells and to one of apply a write signal to an addressed one of the cells in order to produce a desired state in the addressed one of the cells and read out the addressed one of the cells by sensing and analyzing a state of the addressed one of the cells;

a testing device operatively connected to the memory circuit, the testing device including a test writing device and a sequence control device;

the test writing device applying write signals to a selectable subset of the cells in the cell array in order to produce an undefined cell state which lies between the two defined states;

the sequence control device, when being activated, being configured to control the access device and the test writing device such that a test cycle is carried out, the test cycle includes selecting, from the plurality of cells, a target cell together with a set of neighboring cells, the set of neighboring cells including at least those cells for which a possibility of an operation having a fault-producing interaction with an operation of the target cell cannot be ruled out, writing a data item to the target cell in order to produce one of the two defined states, and applying a write signal to the neighboring cells in order to produce an undefined state which lies between the two defined states, reading the target cell and the neighboring cells, and checking whether there is any interaction between an operation of the target cell and an operation of the neighboring cells by using a result of the step of reading the target cell and the neighboring cells.

Other features which are considered as characteristic for the invention are set forth in the appended claims.

Although the invention is illustrated and described herein as embodied in a method and a device for testing a memory circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a table for illustrating various signal states when writing to and reading from the memory in the course of a method according to the invention; and FIG. 3 is a flowchart illustrating an embodiment of the method according to the invention.

DESCRIPTION OF THE PREFERRED EMBODIMENTS

Figure 1:
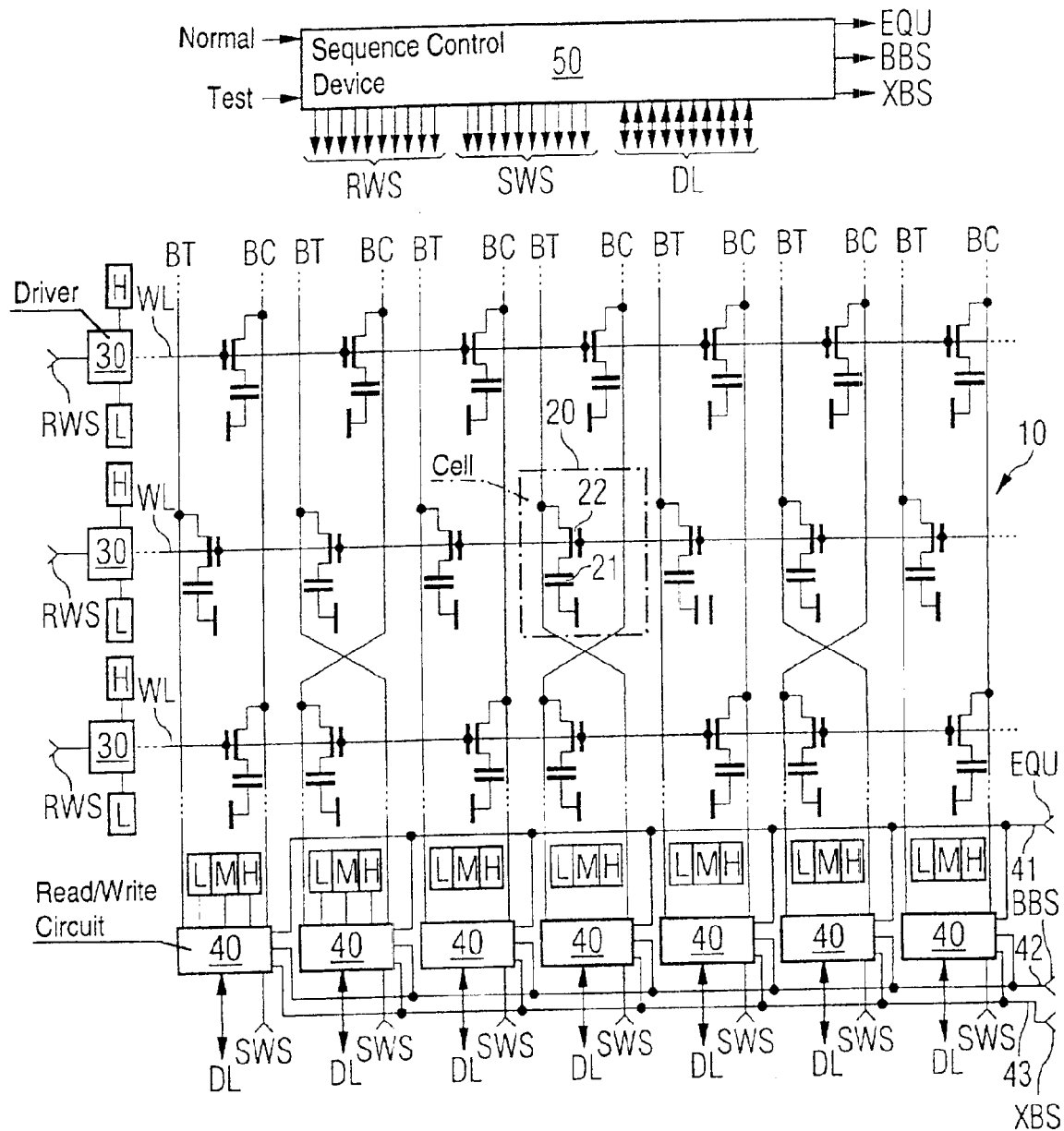
FIG. 1 is a schematic circuit diagram for illustrating parts of a DRAM memory circuit according to the invention.

Referring now to the figures of the drawings, the invention is described in detail wherein the description is based on the following rule: the two defined binary states of a memory cell are referred to, as it is generally done, by the logic symbols "0" and "1", as are the data values associated with these states. The "undefined" intermediate state is referred to as "X". Physically speaking, the "0" corresponds to a level which is equal to or less than a lower threshold value and is referred to as the L level. The "1" corresponds to a level which is positive with respect to the L level and is equal to or greater than an upper threshold value, and is referred to as the H level. The undefined state X corresponds physically to a central level "M" between the upper and lower threshold values, that is to say between the L level and the H level.

FIG. 1 shows, schematically, the layout of the cell array 10 in a dynamic RAM memory (DRAM). The cell array 10 contains a large number of memory cells 20, which form a matrix-like configuration of rows and columns; the figure shows a detail including three rows and seven columns. In practice, there may be several thousand rows and columns. A memory circuit which is integrated on a chip may contain a number of cell array regions, which can be operated separately, as so-called "banks".

The memory cells 20 are all constructed in the same way; they each contain an electrical capacitance 21 and a selection switch 22 which, in the illustrated case, is an n-channel field-effect transistor (n-FET). The capacitance 21 forms the actual storage element, in order to store a binary data item with the logic or data value 0 or 1 through the use of a corresponding charge level L (uncharged) or H (charged). All the cells in the same row are each connected to a common "word line" WL, and all the cells in the same column are each connected to a common "bit line" which, in the illustrated case, is a "paired bit line", including two wires BT ("true" wire) and BC ("complement" wire).

In detail, each word line WL is connected to the gates of the selection transistors 22 of all the cells in the relevant row. One side of the storage capacitance 21 in each cell is connected to a fixed potential, which may have any desired value, for example the ground potential or a potential which corresponds to the L level, or any other suitable potential.

The other side of the storage capacitance 21 is connected via the channel of the selection transistor 22 to one of the two wires BT or BC of the bit line pair BT/BC which is associated with the relevant column. Normally, this connection alternates from row to row between the true wire BT and the complement wire BC, while it is in each case the same for all the cells in the same row, as is shown in FIG. 1. In order to keep the major coupling between the bit line wires in adjacent columns low, the layout is frequently configured such that the BT and BC wires of at least some of the bit line pairs interchange their physical position at various points in the matrix, by crossing over one another. Such a bit line twist is shown in FIG. 1, between the central and lower row in the second, fourth and sixth column.

An access device which controls access to the memory cells contains a dedicated driver 30 for each word line WL, which driver 30 can be controlled by an associated row selection signal RWS, and contains a dedicated read/write circuit 40 for each bit line pair BT/BC, which read/write circuit 40 can be actuated by an associated column selection signal SWS. The signals RWS and SWS are produced in an address decoder which is contained in a circuit block 50 which, in this case, is referred to in general form as a "sequence control device" 50. Each word line driver 30 and each read/write circuit 40 is connected to a source of the L potential and to a source of the H potential. Each read/write circuit 40 also has a connection for a source of the M potential, whose level is in the middle between the L and H potential levels. The following text first of all explains the normal operation of the DRAM memory circuit illustrated in FIG. 1. The individual processes are controlled by the sequence control device 50, once its mode setting input has been set to NORMAL.

Normal Operation:

In the quiescent state, before a write or read access, all the word lines WL are connected by the associated driver 30 to the L level, that is to say they are "deactivated." The read/write circuits 40 hold the bit line wires BT and BC of all the columns so they are "equalized", that is to say they are at the same potential, which may have any desired level and, in the present example, is the M level. This can be achieved through the use of an equalization command signal EQU, which is produced by the sequence control device 50 and is applied to all the read/write circuits 40 via a common line 41.

For access to a cell 20, the bit line wires BT and BC of all the columns are first of all disconnected from the equalization potential, for example by removing the signal EQU, so that they are electrically undefined. The driver 30 for the word line WL to which the relevant cell is attached is then selected by the signal RWS, causing the word line to be switched to the H level, that is to say to be "activated." This results in the selection transistors 22 in all the cells in the relevant row being switched on. Approximately at the same time, the read/write circuit 40 for the column in which the relevant cell is located is activated by the associated column selection signal SWS for a normal write or read operation.

In order to write to the cell 20, the activated read/write circuit 40 is caused to produce a data value 0 or 1, which is produced at its data connection DL, as an L or H level on those bit line wires to which the selection transistor 22 for the relevant cell is connected. In the case of the cell 20 (central row, fourth column) which is surrounded by a dashed-dotted line frame, this is the true wire BT. A data value 0 and hence an L level on BT changes the storage capacitance 21 of the cell 20 to the uncharged state 0, via the switched-on selection transistor 22. A data value 1, and thus an H level, on BT changes the storage capacitance 21 of the cell 20 to the charged state 1, via the switched-on selection transistor 22. After this writing process, the relevant read/write circuit 40 is deactivated again by removing the signal SWS, the relevant word line WL is switched back to the L level, and all the bit line pairs BT/BC are equalized once again through the use of the signal EQU.

In order to read the cell 20 which is surrounded by the dashed-dotted line frame in FIG. 1, the relevant activated read/write circuit 40 is caused to sense and to analyze the potential difference between the two associated bit line wires BT and BC and, depending on the result of the analysis, to supply the data value 0 or 1 to the data connection DL. This process can be activated by an analysis command signal BBS, which is supplied at a given time from the sequence control device 50, via a line 42, to all the read/write circuits 40. The analysis process is normally carried out through the use of a differential amplifier (not shown separately) which is contained in the read/write circuit 40, receives the potential of the true bit line wire BT at its first difference input and receives the potential of the complement bit line wire BC at its second difference input, and switches to one extreme state or the other, depending on the polarity of this difference. If the storage capacitance 21 of the cell is charged (cell state 1), the H potential is applied via the switched-on selection transistor 22 and the connected bit line wire BT to the first difference input, while the second difference input is still floating. The differential amplifier switches to the state which is regarded as the data value 1, and supplies this data value to its data output DL. If, on the other hand, the storage capacitance 21 of the cell is uncharged (cell state 0), the L potential is applied via the switched-on selection transistor 22 and the connected bit line wire BT to the first difference input, while the second difference input is still floating. The differential amplifier switches to the state which is regarded as the data value 0, and supplies this data value to its data output DL. After this reading process, the relevant read/write circuit 40 is deactivated once again by removing the signal SWS, the relevant word line WL is switched back to the L level, and all the bit line pairs BT/BC are equalized once again through the use of the signal EQU.

All the other cells 20 are written to and read from in a corresponding manner during normal operation, controlled by the sequence control device 50. This operation is generally conventional, and is known. Normally, the differential amplifiers in the read/write circuits 40 are configured such that their switching during normal operation changes both difference inputs and thus the bit line wires BT and BC to the full extreme values L and H, so that the data value which has been identified is written back to the relevant cell 20, in order to refresh it. A data value which is received from the outside at the data connection DL also switches the differential amplifier to the respectively associated extreme state during normal operation, so that a new data item is written in the same way.

As mentioned further above, unavoidable local couplings can occur between the selection lines (word lines and bit lines) of different cells, as well as dynamic couplings between the read/write circuits. These couplings can lead to the levels which are produced on the associated bit line during access to any selected "target cell" being governed not just by the data value to be written or the state of the target cell to be read, but also being influenced by access to other cells at a time close to this, or even simultaneously. This can result in faults. The nature and intensity of the effect depend on the respective data topology, that is to say on the states to be produced or to be read both with regard to the target cell and with regard to the other cells.

The configuration and the layout of the cell array as well as the intended operating sequence for normal use of the memory circuit determine which other cells are in the critical vicinity of a target cell, that is to say they are located both in terms of circuitry and operating time so close to the target cell that their data topology could influence the writing and/or reading processes involved with the target cell. The number of such "neighboring cells" can frequently reliably be restricted. In some DRAM memory circuits, the cell array is in practice written to and read from exclusively row-by-row, by addressing, and writing to or reading from, each of the cells in a row at the same time, or shortly one after the other, before moving to another row. In this case, the only cells which are neighboring cells in the above sense are those which are located in the same row as the target cell.

The test method according to the invention is explained in the following text using this case as an example, in conjunction with the DRAM memory circuit illustrated in FIG. 1.

Test Operation:

In the DRAM memory circuit shown in FIG. 1, all the memory cells are selected successively as target cells and a multi-step test cycle is carried out at each target cell before selecting the next target cell. The individual steps in the test cycle are described in the following text with reference to the flowchart shown in FIG. 3. The individual processes are controlled by the sequence control device 50, once its mode setting input has been switched from NORMAL to TEST.

First of all, the memory region to be tested is selected (step 200 in FIG. 3) and the first target cell within this region is selected. This cell may be, for example, the cell 20 with a dashed-dotted line frame in the central row (target row) and in the fourth column from the left (target column) in the detail of the cell array 10 shown in FIG. 1. Accordingly, only the word line WL in the target row is at the H level. In order to write to the target cell, the data value 1 is selected, by way of example (step 201); the data value 1 is thus applied to the data connection DL of the read/write circuit 40 for the target column. This is followed by a first test writing process, in which the read/write circuits are conditioned such that the applied data value 1 is written to the target cell, and the bit line wires BT and BC of all the other columns have the central level M applied to them (step 202). The corresponding conditioning of the read/write circuits can be carried out by simultaneous activation of the equalization command signal EQU and of a signal XBS which is applied to all the read/write circuits and, when in the active state, ensures that only that read/write circuit 40 whose data line DL receives a defined data value 0 or 1 from the outside is excluded from the equalization process, and is thus caused to write this value to the target cell.

Assuming fault-free operation, the described test writing process changes the target cell to the defined 1 state, while the other cells in the target row change, as "neighboring cells", to an "undefined" intermediate state X. This is shown in the first row of the table illustrated in FIG. 2.

This is followed by a first reading process, in which, with the word line WL for the target row being activated, the read/write circuits 40 are controlled such that they sense and analyze the levels on the associated bit lines, and indicate the analysis result at their respective data connection DL (step 203). More detailed analysis of this result allows conclusions to be drawn about any effects there may be from operation of the target cell on the operation of the neighboring cells.

If the read/write circuits allow nuanced analysis of the sensed levels, so that "undefined" values X can be assessed and indicated as such, then the analysis is very simple. If, during the reading process, the sense level of the target cell is assessed to be 1, and the sense levels of all the neighboring cells are assessed to be X, then there is no risk of any fault for any conceivable data topology which contains a 1 in the target cell. However, if the sense levels of any of the neighboring cells are assessed as being 1 or 0 during the reading process, then there is a risk of faults. The above writing and reading process need be repeated only once, to be precise with a 0 for the target cell, in order in a similar way to check whether there is a risk of faults for any of the data topologies which contain a 0 in the target cell. The next target cell is then selected for the same test.

However, if, as in the case of the circuit technique described above with reference to FIG. 1 by way of example, the analyzing differential amplifier in the read/write circuits 40 can switch only to one or the other extreme state, some defined data value will also be indicated for each memory cell which is written to in an undefined manner, to be precise by preference that which is closest to the sensed level. If the sensed level is precisely at the mid-point between L and H, there is a 50% probability for each of the two defined data values 0 and 1 in the readout. The data values 0 and 1 would thus ideally occur with equal frequency in the readout from the neighboring cells. An analysis of the frequency of 0s and 1s in the readout can thus be used to deduce whether there are any interactions between the target cell and the neighboring cells. Even this allows a certain amount of quality control for the memory circuit, but this can be improved by repeating the previously described step sequence once or more for the same target cell, and it is highly desirable in this case to change the data value written to the target cell.

However, the test cycle that has been started is preferably continued through the use of additional steps in order to achieve a more valid test result through the use of more detailed testing. The second row of the table in FIG. 2 shows one possible bit pattern which could appear at the data connections DL of the seven illustrated columns in the described reading process (step 203). The fourth bit, that is to say the data value which is read from the target cell in the fourth column, is equal to 1 and, as expected, corresponds to the data value written there. Of the other bits, some are equal to 0 and some are equal to 1, which may be purely random (on the basis of the ideal 50:50 probability), or may be the consequence of interaction with the writing or reading operation to or from the target cell.

Let us assume that the readout from a neighboring cell has been driven in the direction of 1 by coupling to the 1 readout from the target cell rather than this being purely random. In this case, such coupling during normal operation could lead to a fault in a destructive manner only if the relevant neighboring cell were to contain a 0 since, otherwise, the coupling-dependent driving of the neighboring cell in the direction of 1 would be constructive, and would not result in any risk of an incorrect readout from the target cell. A similar argument applies to the converse case: if, during the described test reading process, the data value from a neighboring cell has been driven by virtue of coupling to 0 by the 1 readout from the target cell, then the relevant coupling could in normal operation lead to a fault in a destructive manner only if the relevant neighboring cell were to contain a 1.

It is evident from this analysis that the inverted pattern of the data values which are obtained from the neighboring cells which have been written to in an undefined manner during the first test reading process (step 203) is the most critical of all the possible data topologies for the respective target cell. A cell array can thus itself find the most critical data topology for each cell. The following test steps make use of this knowledge. Accordingly, the values read from the neighboring cells are inverted and are temporarily stored at a suitable point, together with the unchanged value read from the target cell (step 204). This data record, whose bit pattern is shown in the third row of the table in FIG. 2, is then used as a test data record for testing precisely the same cells. This test (step 205) is carried out by writing the test data record to the relevant cells, and reading it out again, and by comparing (step 206) the read-out version with the written version, a copy of which is stored in the temporary storage for this purpose. The test should preferably be carried out using critical settings for the timings, the voltages, the temperature, etc.

If the comparison (step 206) indicates a fault, that is to say some point at which the compared data records do not match, then a fault message is produced and is recorded (step 207). The fourth row in the table in FIG. 2 shows the situation where the third and fourth bits have been corrupted. This shows that the data topology indicated in the third row of the table is critical for the target cell and for its neighboring cell on the left. Following the fault message, the next target cell is selected (step 208), and the next test cycle starts with the step 202.

If the comparison (step 206) does not indicate any faults, a check is carried out to determine whether all the cells have been selected as target cells (step 209). If no, the next target cell is selected (step 208), and the next test cycle starts again with the step 202. If yes, the entire test of the selected memory region can be ended as being successful. However, for the sake of safety, it is preferable to repeat the entire operation, with each of the data values to be written to the target cell being changed from 0 to 1 (steps 210 and 211). The test for the selected memory region is not ended, with a change possibly then being made to another memory region which has not yet been tested, until this has been done (step 212).

Instead of inverting (step 204) the data read from the neighboring cells after the first reading process (step 203), the data item read from the target cell can alternatively be inverted, with the data read from the neighboring cells being transferred to the test data record without being changed.

It is desirable to use a region (for example a bank) of the memory which is excluded from the test cycles described above for the temporary storage (step 204). This region must then be tested separately. In this case, a previously tested region or some other region which has not yet been tested may once again be used as a temporary storage. It is virtually impossible for coupling-dependent faults to remain unidentified in this case, because any possible fault during operation of the temporary storage is also evident as a fault in the test cycle. It is extremely improbable that a fault in a temporary storage area will actually be cancelled out by a fault in the respective region to be tested.

Once all the cells in the memory (or in a subregion) have been selected as target cells and the described test cycle has been carried out on each occasion, each of these cells will have been operated with the respectively most critical data topology. If no faults have occurred anywhere in the process, then it is possible to be certain that all the other data topologies will also be written to and read from without any faults. It is thus possible to test a memory very reliably with a limited number of writing and reading processes.

The invention is, of course, not restricted to the examples described above. This applies both with respect to the types of memory circuit and to the configuration of the individual method steps.

The generic type and internal layout of the memory as well as correct follow-up control of the memory operation govern how far that region of the "neighboring cells" which is relevant to the data topology extends in the area around the target cell. In the case of DRAMs, which are normally operated row-by-row, it is generally sufficient to select only the specimen located in the same row as neighboring cells of a target cell; if the packing densities are low and the twist patterns of the bit lines are relatively uncomplicated, it may even be sufficient to select only the closest adjacent examples within the same row. If it is impossible to rule out couplings from one row to another from the start, the region of the neighboring cells must be extended to adjacent rows. To be on the safe side for all situations, of course, all the other cells in the memory or in the autonomous subregion should be selected and regarded as neighboring cells for each target cell when testing a memory or a relatively autonomous subregion (for example a bank).

The invention is, of course, also applicable to memories which operate with single bit lines rather than with pairs of bit lines since, even there, topology-dependent faults can occur, which are covered in the same way by the method according to the invention. Topology-dependent faults can also occur in static RAMs (so-called SRAMs) so that the method according to the invention also results in advantages with this generic type of memory. The invention is also not restricted to memories with cells whose binary states are defined by an electrical charge or are caused through the use of a charge transfer.

The circuitry which is required to carry out a test method according to the invention may at least partially be integrated on the same chip as the memory circuit itself.

We claim:

1. A method for testing a memory circuit, the method which comprises:

providing the memory circuit with a cell array and an access device, the cell array including a plurality of cells for storing a binary data item as one of two defined states, the access device being configured to selectively address the cells and to one of apply a write signal to an addressed one of the cells in order to produce a desired state in the addressed one of the cells and read out the addressed one of the cells by sensing and analyzing a state of the addressed one of the cells;

successively selecting all cells in at least one region of the cell array as target cells and carrying out a test cycle on each of the target cells, the test cycle including:

A) selecting a target cell together with a set of neighboring cells, the set of neighboring cells including at least those cells for which a possibility of an operation having a fault-producing interaction with an operation of the target cell cannot be ruled out;

B) writing a data item to the target cell in order to produce one of the two defined states, and applying a write signal to the neighboring cells in order to produce in the neighboring cells an undefined state which lies between the two defined states;

C) reading the target cell and the neighboring cells; and

D) checking whether there is any interaction between an operation of the target cell and an operation of the neighboring cells by using a result of the step of reading the target cell and the neighboring cells.

2. The method according to claim 1, wherein step B) comprises applying the write signal to the neighboring cells such that the undefined state lies substantially at a mid-point between the two defined states.

3. The method according to claim 1, which comprises selecting, as the neighboring cells, all cells in the at least one region of the cell array other than the target cell.

4. The method according to claim 1, which comprises:
providing the cells in the cell array in a form of a matrix of rows and columns and connecting all cells in each respective one of the rows to a respective common word line, and connecting all cells in each respective one of the columns to a respective common bit line such that cell states are written to and sensed via the common word line and the common bit line; and
selecting, as the neigboring cells, at least those cells which are located in a same row as the target cell and are up to a given distance away from the target cell.

5. The method according to claim 4, which comprises selecting, as the neighboring cells, at least all cells other than the target cell which are located in a same row as the target cell.

6. The method according to claim 4, which comprises selecting, as the neighboring cells, only all those cells other than the target cell which are located in a same row as the target cell.

7. The method according to claim 2, which comprises:
repeating steps A) to C) a number of times and storing respectively read data values in a storage; and
using, in step D), the data values stored in the storage in order to check whether and which of the neighboring cells predominantly give one of a same data value as a data value of the target cell and a data value complementary to the data value of the target cell.

8. The method according to claim 1, wherein step D) comprises:
D1) writing a data value read from the target cell in step C) back to the target cell without changing the data value, and writing data values read from the neighboring cells in step C) in an inverted form back to respective ones of the neighboring cells;
D2) reading the target cell and the neighboring cells once again for providing a given set of data values, and comparing the given set of data values with a set of data values written back in step D1); and
D3) producing a fault message if the given set of data values and the set of data values written back in step D1) do not match.

9. The method according to claim 1, wherein step D) comprises:
D1) writing a data value read from the target cell in step C) in an inverted form back to the target cell, and writing data values read from the neighboring cells in step C) unchanged back to respective ones of the neighboring cells;
D2) reading the target cell and the neighboring cells once again for providing a given set of data values, and comparing the given set of data values with a set of data values written back in step D1); and
D3) producing a fault message if the given set of data values and the set of data values written back in step D1) do not match.

10. The method according to claim 1, which comprises repeating the test cycle including steps A) to D) for each of the target cells wherein the data item is written to the target cell for producing a respective other one of the two defined states.

11. The method according to claim 1, which comprises using a subregion of the cell array that contains neither the target cell nor the neighboring cells for temporarily storing data values read from the target cell and from the neighboring cells.

12. In combination with a memory circuit including a cell array and an access device, the cell array including a plurality of cells for storing a binary data item as one of two defined states, the access device being configured to selectively address the cells and to one of apply a write signal to an addressed one of the cells in order to produce a desired state in the addressed one of the cells and read out the addressed one of the cells by sensing and analyzing a state of the addressed one of the cells, a device for testing the memory circuit, comprising:
a test writing device for applying write signals to a selectable subset of the cells in the cell array in order to produce an undefined cell state which lies between the two defined states;
a sequence control device operatively connected to the access device and said test writing device; and
said sequence control device, when being activated, being configured to control the access device and said test writing device such that a test cycle is carried out, the test cycle includes selecting, from the plurality of cells, a target cell together with a set of neighboring cells, the set of neighboring cells including at least those cells for which a possibility of an operation having a fault-producing interaction with an operation of the target cell cannot be ruled out, writing a data item to the target cell in order to produce one of the two defined states, and applying a write signal to the neighboring cells in order to produce in the neighboring cells an undefined state which lies between the two defined states, reading the target cell and the neighboring cells, and checking whether there is any interaction between an operation of the target cell and an operation of the neighboring cells by using a result of the step of reading the target cell and the neighboring cells.

13. The device according to claim 12, wherein at least said test writing device and the memory circuit form an integrated chip.

14. The device according to claim 12, wherein at least said test writing device, said sequence control device and the memory circuit form an integrated chip.

15. A semiconductor chip, comprising:
a memory circuit including a cell array and an access device, said cell array including a plurality of cells for storing a binary data item as one of two defined states, said access device being configured to selectively address said cells and to one of apply a write signal to an addressed one of said cells in order to produce a desired state in said addressed one of said cells and read out said addressed one of said cells by sensing and analyzing a state of said addressed one of said cells;
a testing device operatively connected to said memory circuit, said testing device including a test writing device and a sequence control device;
said test writing device applying write signals to a selectable subset of said cells in said cell array in order to produce an undefined cell state which lies between the two defined states;
said sequence control device, when being activated, being configured to control said access device and said test writing device such that a test cycle is carried out, the test cycle includes selecting, from said plurality of cells, a target cell together with a set of neighboring cells, said set of neighboring cells including at least those cells for which a possibility of an operation having a fault-producing interaction with an operation of said target cell cannot be ruled out, writing a data item to said target cell in order to produce one of the two defined states, and applying a write signal to said neighboring cells in order to produce in the neighboring cells an undefined state which lies between the two defined states, reading said target cell and said neighboring cells, and checking whether there is any interaction between an operation of said target cell and an operation of said neighboring cells by using a result of the step of reading said target cell and said neighboring cells.

* * * * *